United States Patent [19]
Burns

[11] Patent Number: 5,511,010
[45] Date of Patent: Apr. 23, 1996

[54] METHOD AND APPARATUS OF ELIMINATING INTERFERENCE IN AN UNDERSETTLED ELECTRICAL SIGNAL

[75] Inventor: Mark A. Burns, Garland, Tex.

[73] Assignee: Texas Instruments Incorporated, Dallas, Tex.

[21] Appl. No.: 258,049

[22] Filed: Jun. 10, 1994

[51] Int. Cl.$^6$ ..................................... G06F 11/00
[52] U.S. Cl. .................... 364/574; 364/485; 375/346; 455/796; 324/615
[58] Field of Search ............... 324/76.12, 76.19, 324/612, 613, 615–620; 455/63, 67.3, 296–307; 364/485, 574–576; 375/346–350

[56] References Cited

U.S. PATENT DOCUMENTS

| | | | |
|---|---|---|---|
| 3,808,526 | 4/1974 | Jackson | 324/57 R |
| 3,988,667 | 10/1976 | Roth et al. | 324/57 N |
| 4,207,624 | 6/1980 | Denting et al. | 367/135 |
| 4,995,104 | 2/1991 | Gitlin | 455/295 |
| 5,247,458 | 9/1993 | Cabot | 364/550 |
| 5,263,019 | 11/1993 | Chu | 370/32.1 |
| 5,353,310 | 10/1994 | Russell et al. | 375/101 |
| 5,398,286 | 3/1995 | Balestri et al. | 381/94 |

OTHER PUBLICATIONS

Rameriez, Robert, "The FFT Fundamentals and Concepts", Prentice–Hall, Inc. Englewood Cliffs, N.J. 07632, 1985, pp. 102–115.

Tetradyne, Inc. "Test Technique Note MS2: Spectrum Analysis Using the Chirp–Z Transform", Tetradyne Inc., 321 Harrison Ave. Boston, MA 02118, 1989, pp. 2–5.

Mahoney, Mathew, "DSP–Based Testing of Analog and Mixed Signal Circuits", The Computer Society of the IEEE, 1730 Massachusetts Avenue N.W. Washington, DC 20036–1903, 1987, pp. 35–74.

Siebert, William, "Circuits, Signals, and Systems", The MIT Press, Cambridge, MA, 1986, pp. 560–562.

*Primary Examiner*—Emanuel T. Voeltz
*Assistant Examiner*—Craig Steven Miller
*Attorney, Agent, or Firm*—Tammy L. Williams; Leo N. Heiting; Richard L. Donaldson

[57] ABSTRACT

The present invention includes a method of eliminating interference from an undersettled electrical signal, the undersettled electrical signal including a test signal at a known frequency. One embodiment of the present invention includes a method comprising the steps of providing a digitized version of the undersettled electrical signal (at 46); generating a frequency spectrum of the digitized version of the undersettled electrical signal (at 56); spectrally interpolating the frequency spectrum to generate an interference signal frequency spectrum (at 65); and subtracting the interference signal frequency spectrum (at 65) from the undersettled signal frequency spectrum (at 56) generating a settled signal spectrum (at 75). Another embodiment of the present invention includes a system comprising means (40 or 45) responsive to the undersettled electrical signal for producing a digitized version of the undersettled electrical signal (at 46); means (50) responsive to the digitized version of the undersettled signal for transforming the digitized version of the undersettled signal into a transformed signal; and means (60 and 70) including a spectral interpolator (60) responsive to the transformed signal for removing interference from the transformed signal generating a settled signal output (at 75).

14 Claims, 5 Drawing Sheets

FIG. 3a — COHERENT MULTITONE SIGNAL (SAMPLING INTERVAL, 210)

FIG. 3b — NON-COHERENT MULTITONE SIGNAL (DISCONTINUITY, 250)

FIG. 4a — UNDERSETTLED SIGNAL WITH EXPONENTIAL DECAY (310)

FIG. 4b — ERRONEOUS FFT INTERPRETATION OF THE UNDERSETTLED SIGNAL (350)

FIG. 14 the present invention comprises a method and a system of eliminating interference from an undersettled electrical signal.

5,511,010

METHOD AND APPARATUS OF ELIMINATING INTERFERENCE IN AN UNDERSETTLED ELECTRICAL SIGNAL

TECHNICAL FIELD OF THE INVENTION

This invention relates in general to the field of test system engineering, and more particularly to a method and system utilizing digital signal processing for removing interference from an undersettled electrical signal.

BACKGROUND

Test engineering is an important and constantly growing area of engineering practice especially in the field of integrated circuit design. The test engineer is ideally involved in the development cycle of a device from start to finish and provides invaluable insight on the performance of the device. As in other branches of engineering, i.e., design, more and more of the tools used by the test system engineer to test device performance are simulation or modeling systems which run on a computer. The data used in these simulations, however, is still collected using hardware and connections which, while providing the computer with direct access to real data, create additional problems by introducing interference into the output signal of the device under test. This interference in turn affects the accuracy of any test or calculations using the device output.

The interference introduced by the testing equipment comes in a variety of forms. One form of interference can be caused by the testing approach itself. This results from the fact that the device output signal may exhibit settling in the form of exponential decay. If the testing process calls for sampling such a signal too early, i.e., prior to settling to its "final" state, the tester may mistakenly assume the signal is different from that at the "final" state. Thus, the test measurement is said to have occurred at a time when the signal is undersettled. With an undersettled signal, repeating the same measurement on the undersettled output signal of the device under test produces varying results.

The effect of the exponential settling curve is eliminated in prior art approaches by waiting for the signal to settle to a steady state prior to measuring its state. The extra wait time, however, can add up to hundreds of milliseconds of additional test time per device. Testing equipment, costing several million dollars and having a fixed useful life, thus processes fewer devices during that useful life, resulting in a higher production cost per device. Alternatively, the exponential decay can be eliminated by changing the hardware configuration to eliminate the source of the decay. For example, in the case of an AC coupled signal, a blocking capacitor can sometimes be shorted out to eliminate its effect. However, this approach is often not a viable solution since the blocking capacitor modifies the nature of the circuit of the device under test and thus introduces further inaccuracies.

Another approach to eliminating the exponential decay is to "squeeze" the endpoints of the captured signal towards zero, in effect forcing coherence (i.e., forcing the endpoints of the signal to wrap around smoothly from one period to the next). This is accomplished by a process called windowing. Windowing is a well known technique in digital signal processing and in test engineering. Windowing is a digital signal processing technique of partitioning a long sequence into smaller subsections by multiplying the long sequence by a shorter sequence of non-zero values (usually by a shorter sequence of all ones). For example, the sequence 8, 3, 6, 4, 1, 0, 2, 3 windowed using the sequence 0, 0, 0, 1, 1, 1, 0, 0 produces the sequence 0, 0, 0, 4, 1, 0, 0, 0.

Windowing, however, has a well known side effect in that it too, like the blocking capacitor, introduces substantial error in the measured signal level. The error arises because windowing allows some of the energy at each frequency in the measured signal to spread into adjacent spectral bins, lowering the apparent measured signal levels. Windowing also fails to eliminate the energy from the exponential decay, so the measured signal levels remain corrupted.

Another source of noise or interference in signals is 60 Hertz power hum. 60 Hertz power hum is very difficult to extract. One prior art solution to this problem is to try to avoid the 60 Hertz power hum interference altogether by using good hardware design. In many situations, however, this is not possible and the effect of 60 Hertz power hum is simply tolerated.

SUMMARY

The present invention comprises a method and a system of eliminating interference from an undersettled electrical signal.

In accordance with one embodiment of the present invention, the method includes eliminating interference from an undersettled electrical signal, the electrical signal including a test signal at a known frequency, comprising the steps of providing a digitized version of the undersettled electrical signal; generating a frequency spectrum of the digitized version of the undersettled electrical signal; spectrally interpolating the frequency spectrum of said digitized version of said undersettled electrical signal to generate an interference signal spectrum; and subtracting the interference signal spectrum from the undersettled electrical signal frequency spectrum to generate a settled signal spectrum.

In accordance with another embodiment of the present invention, a system is provided which includes means for producing a digitized version of an undersettled electrical signal, means for transforming the digitized version of the undersettled electrical signal, and means including a spectral interpolator responsive to the transformed signal for removing interference from the transformed undersettled electrical signal generating a settled signal output.

BRIEF DESCRIPTION OF THE DRAWINGS

For a better understanding of the present invention, reference may be made to the accompanying drawings, in which.

DETAILED DESCRIPTION

Figure 1:
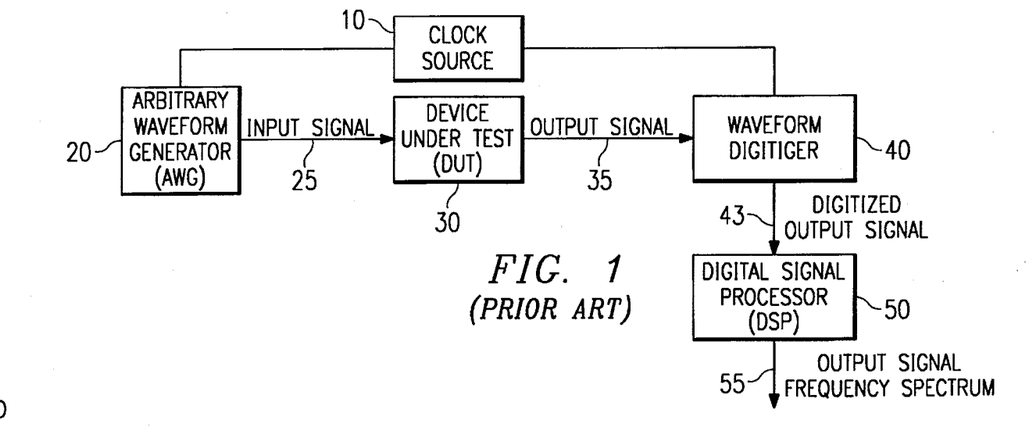
FIG. 1 is a block diagram of a digital signal processing based measurement system of the prior art.

A generic measurement system is shown in FIG. 1. The system consists of a clock source 10, an arbitrary waveform generator (AWG) 20, the device under test (DUT) 30, a waveform digitizer 40, and a Digital Signal Processor (DSP) 50. A typical measurement system can be more complex, but this generic system is illustrative for the testing problem that this invention solves.

The clock source 10 provides a common clock for the AWG 20 and the waveform digitizer 40. The common clock ensures that the frequency of the input signal at 25 into the DUT 30 is an integer multiple of the frequency of the digitized output signal at 43 from the waveform digitizer 40.

The AWG 20 provides an input signal at 25 to the DUT 30. The input signal at 25 is typically a combination of one or more sine and cosine signals at various well defined frequencies and levels. This type of signal is called a multitone signal, or a multiple tone signal. A signal comprising one sine and/or one cosine signal at a single frequency is called a single tone signal. The DUT 30 produces an output signal at 35, which should have spectral components at the same frequency or frequencies as the input signal at 25. The DUT 30 usually modifies the signal level at each frequency (introducing gain or attenuation) and may also add harmonic distortion and noise to the output signal at 35.

The waveform digitizer 40 samples the output signal at 35 at regular intervals creating a numerical "plot," or digitized output signal at 43, of the DUT 30 output signal at 35. The DSP 50 then splits the digitized output signal at 43 into separate frequency components, or "bins," so that the signal level at each frequency included in the output signal at 35 of the DUT 30 can be measured independently. This reduces test time in that all frequency components of the output signal at 35 can be measured in one reading. Furthermore, random noise not located at an input signal frequency is isolated which improves repeatability of the measurement.

It should be noted that the AWG 20 may be replaced by a digital signal source for digital-to-analog converter testing. Similarly, the waveform digitizer 40 may be replaced by a digital capture memory 45, to perform analog-to-digital converter testing. The digital signal processing approach to testing gain, distortion, etc. as described in the present invention is the same in the case of a digital signal output as it is in the case of the pure analog signal output from the DUT 30. Since spectral interpolation is equally useful in both cases, the present invention includes the use of the various types of measurement systems.

Using the digital signal processing based approach of the present invention to isolate the test signal energy levels at the various test signal frequencies, the test engineer can quickly and accurately measure and/or calculate electrical test parameters such as gain, power supply rejection ratio (PSRR), common mode rejection ratio (CMRR), frequency response, harmonic distortion, signal to noise ratio (SNR), etc. The accuracy of these and other performance evaluation measurements are improved using the method and system of the present invention.

Figure 2A:
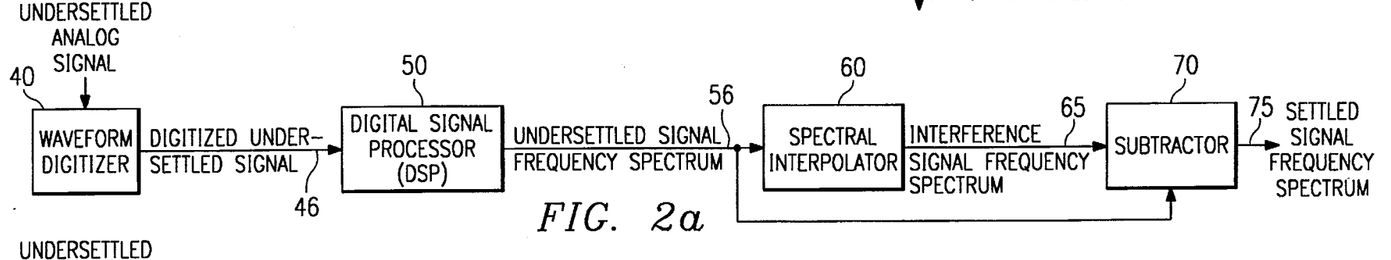
FIGS. 2(a) and 2(b) are block diagrams each showing one embodiment of the present invention.
Figure 2B:
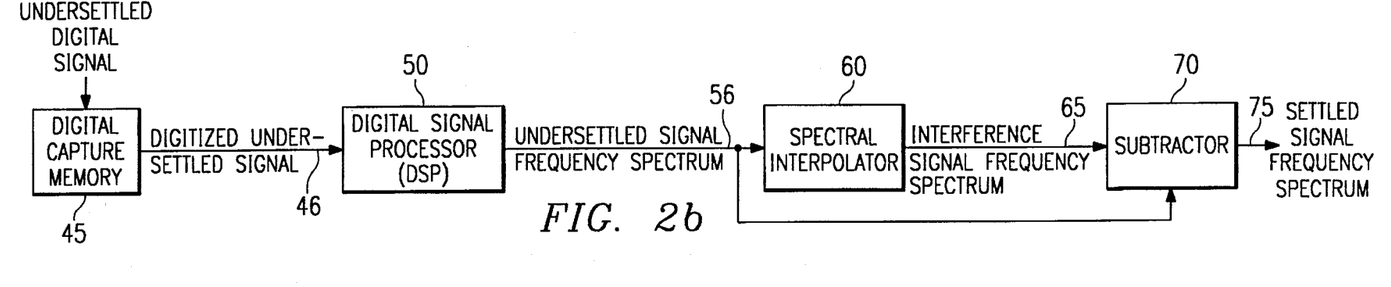

One embodiment of the present invention includes the digital signal processing based measurement system using the spectral interpolation method as illustrated in FIG. 2(a). The digital signal processing based measurement system of FIG. 2(a) includes a waveform digitizer 40, a DSP 50, a spectral interpolator 60, and a subtracter 70. Another embodiment of the present invention using spectral interpolation, shown in FIG. 2(b), replaces the waveform digitizer 40 in FIG. 2(a) with a digital capture memory 45 for analog-to-digital testing. Both embodiments of the measurement system of the present invention provide quicker and more accurate results in most cases than digital signal processing based measurement systems of the prior art.

Once the digitized output signal at 43 of the undersettled electrical output signal at 35 of the DUT 30 is obtained, the DSP 50 calculations typically begin with a Fast Fourier Transform (FFT) of the digitized output signal at 43. The FFT converts the time domain signal into a frequency domain representation, or output signal frequency spectrum at 55. The FFT assumes that the signal to be transformed represents a segment of a repeating signal. If the endpoints of the signal transition smoothly from one period to the next, this is called a coherent signal and each frequency component of the output signal at 35 falls into its own Fourier spectral bin. If there is a discontinuity in the endpoints, i.e. the signal does not transition smoothly from one period to the next, then the signal is non-coherent. In the case of a non-coherent signal, some of the energy level from each frequency component of the output signal at 35 "leaks" into the other spectral bins, corrupting the other signal energy levels. For this reason, the FFT normally cannot be used on non-coherent signals without some form of preprocessing, i.e., windowing.

Figure 3A:
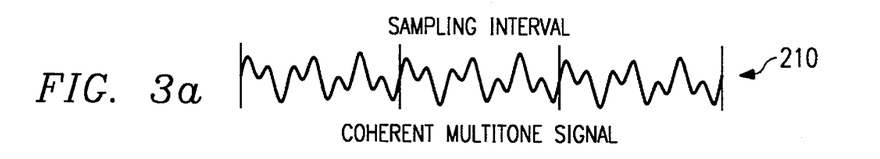
FIGS. 3(a) and 3(b) show a coherent and a non-coherent multitone signal, respectively.
Figure 3B:
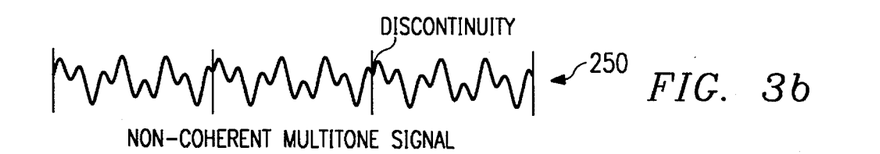

Windowing, however, has the unfortunate effect of spreading the energy of each signal component into adjacent bins, thereby destroying the accuracy of AC tests. For this reason, test engineers usually restrict themselves to coherent sampling systems. Coherent and non-coherent multitone signals are illustrated in FIGS. 3a and 3b, respectively. One way of achieving coherence is to provide a common clock source 10 between the signal source and capture hardware. Although the sampling rates are not always set to the same frequency, in order for the signals to be coherent, the sampling rates should at least be related by a very precise ratio. The common clock source 10 is one method of ensuring that the sampling rates are synchronous.

Figure 4A:
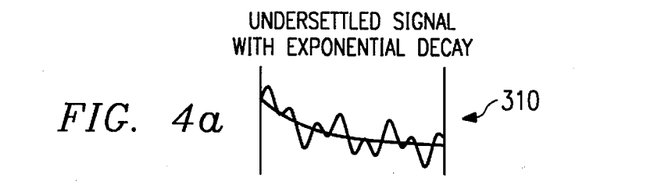
FIG. 4(a) shows an undersettled signal with exponential decay.
Figure 4B:
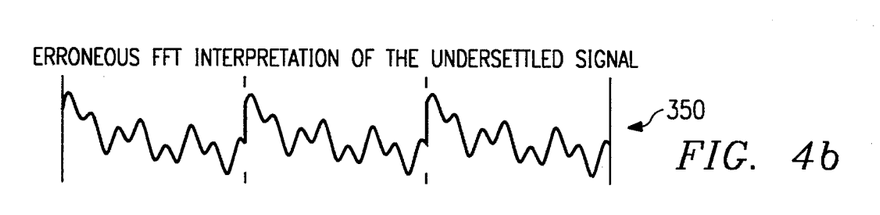
FIG. 4(b) shows a Fast Fourier Transform (FFT) interpretation of the undersettled signal of FIG. 4(a)

It is also vital in prior art systems that the DUT 30 be given sufficient time to settle before samples are collected. If the device output signal at 35 exhibits an exponential decay, for example, then the FFT thinks it is looking at a very different signal than if the output signal at 35 does not exhibit exponential decay as illustrated in FIGS. 4a and 4b. The signal in FIG. 4b has frequency components throughout the FFT spectrum, so the output signal at 35 of the DUT 30 has been corrupted.

Figure 5:
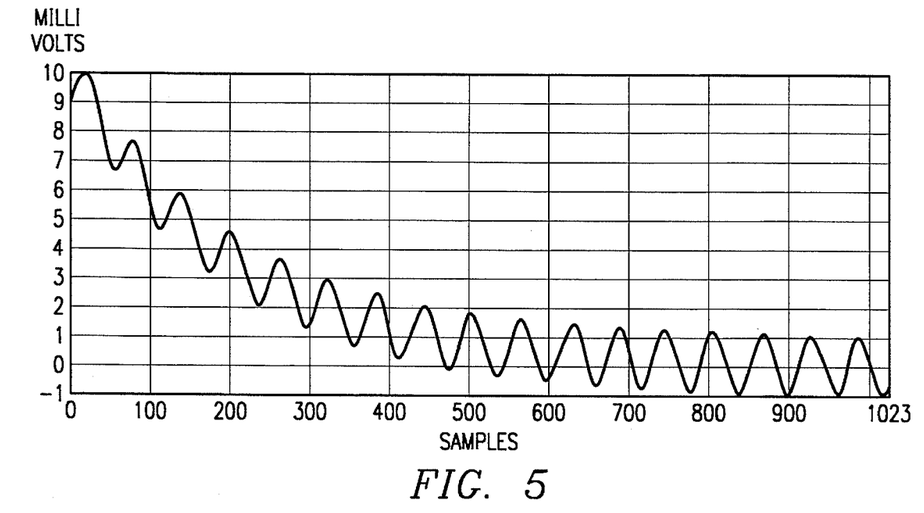
FIG. 5 shows an undersettled single tone test signal with exponential decay.
Figure 6:
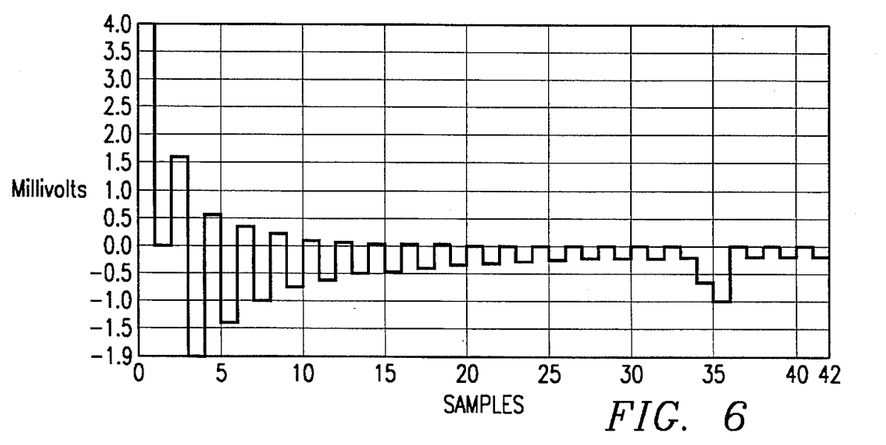
FIG. 6 shows a non-windowed FFT of the undersettled single tone test signal of FIG. 5.

Consider the example in FIG. 5 which shows a single tone test signal corrupted with exponential decay. FIG. 6 shows the non-windowed FFT of the single tone test signal with exponential decay shown in FIG. 5. FIG. 6 illustrates how the exponential decay throws interference on top of the test signal, corrupting the test signal energy level. Thus, digital signal processing based measurement systems of the prior art include a wait time before performing measurements, to get rid of the decay curve. Test engineers have long been told by test equipment manufacturers and industry experts that they should never perform a non-windowed FFT on this type of signal.

As noted earlier, prior art methods for performing tests on corrupted signals centered around finding ways to eliminate the exponential decay. The key, however, to using the corrupted signal without waiting for the signal to settle is not to eliminate the interference signal from the test signal but instead to eliminate the test signal from the interference signal. Once the test tone is removed, the test engineer knows exactly what the interference looks like. Spectral interpolation is a method of the present invention which is used to separate the interference signal from the test signal. Spectral interpolation is based on the fact that a non-windowed FFT of certain types of non-coherent interference signals produces a frequency spectrum with fairly well-behaved properties.

Figure 7:
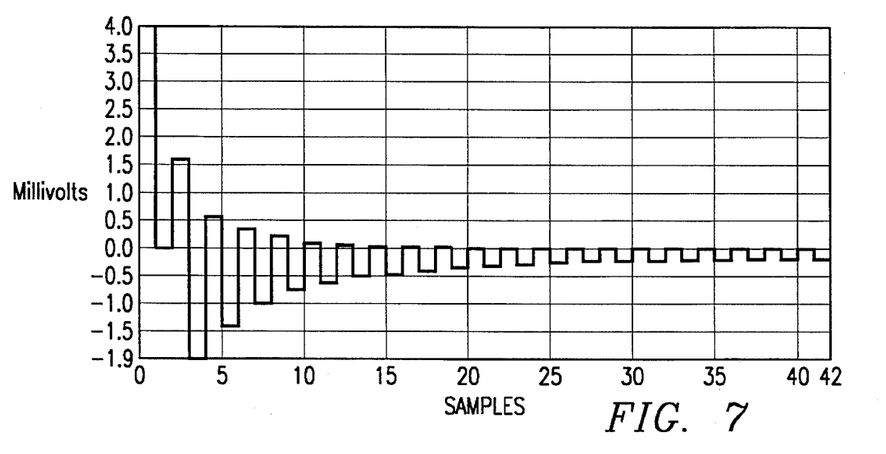
FIG. 7 shows the reconstructed FFT of FIG. 6 with the single tone test signal removed.
Figure 8:
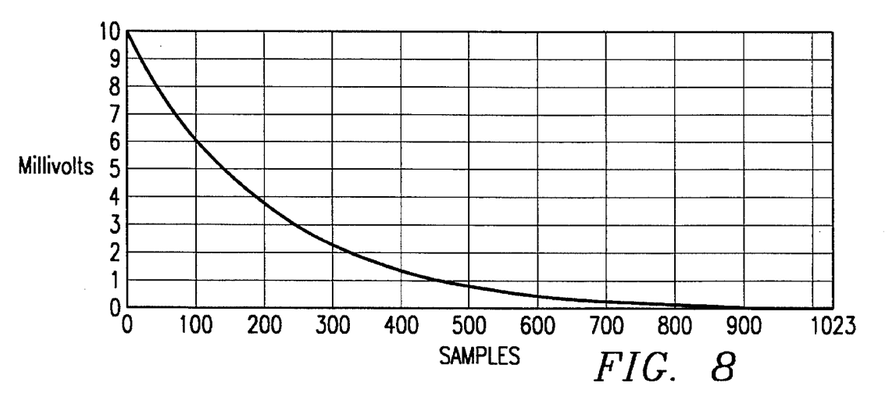
FIG. 8 shows the inverse of the reconstructed FFT of FIG. 7.

FIG. 7 shows the frequency spectrum of the single tone test signal of FIG. 5 with the sine and cosine spectral components at the known frequency tone replaced with estimated values of the unknown interference signal components at the known frequency. The unknown interference signal components are calculated using spectral interpolation. FIG. 7 thus shows a reconstructed interference spectrum using the estimated interference signal components. FIG. 8 shows the inverse FFT of the interference spectrum of FIG. 7. Subtracting the interference signal from the original signal output shown in FIG. 5 leaves the settled signal output.

The reason for this counter-intuitive approach is that the test engineer knows exactly where the test signal is located in the FFT spectrum. It occupies a single FFT bin (if a single tone test signal is used) which the test engineer specifies. Once the spectrum components at the known frequency tone are removed, the frequency spectrum is reconstructed or "patched" using adjacent spectrum components. Using a simple 2-point interpolation (averaging two adjacent bins) the interference spectrum can be closely approximated, as shown in FIG. 7. The sine component of the interference spectrum is reconstructed using the sine component of adjacent spectrum bins and the cosine component is reconstructed using the cosine component of adjacent spectrum bins.

The inverse FFT of this reconstructed signal spectrum, shown in FIG. 8, shows that the test signal has been almost completely removed, leaving only the exponential decay.

Figure 9:
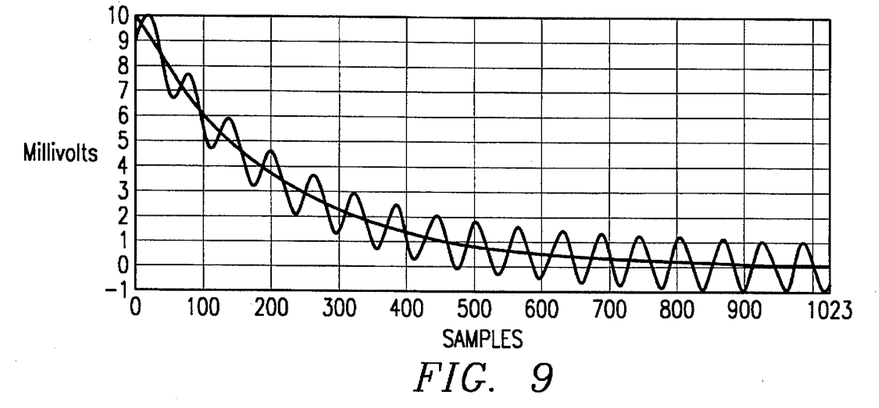
FIG. 9 shows the original undersettled signal of FIG. 5 with the extracted exponential decay signal.

FIG. 9 shows the extracted interference superimposed on the original output signal shown in FIG. 5. Clearly, this approach works well in extracting the exponential decay component of the undersettled signal.

Figure 10:
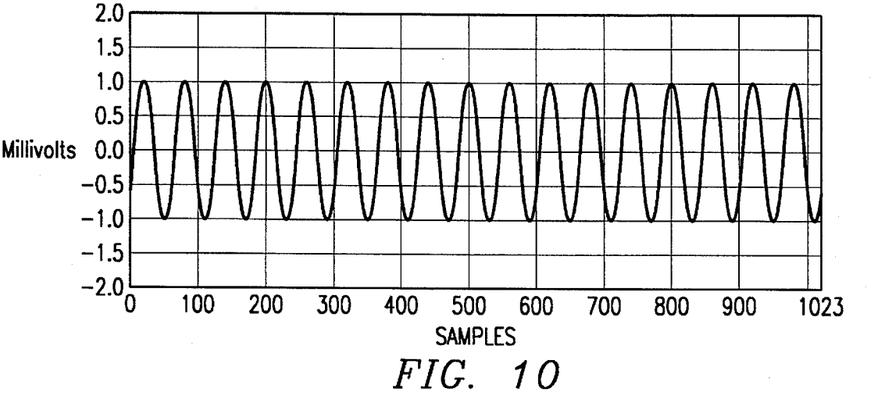
FIG. 10 shows the test signal extracted from the original undersettled signal of FIG. 5.

Finally, as shown in FIG. 10, the test signal can be separated from the original undersettled signal. The test engineer could now perform another FFT to calculate the signal energy level. However, it is important to note that the inverse FFT (or forward FFT) is completely unnecessary, since subtraction in the time domain is identical to subtraction in the frequency domain! This means the test engineer can simply perform the spectral interpolation to determine an estimated value of the interference signal component and subtract the estimated value of the interference signal component from the original spectrum component to calculate the settled signal energy level. This technique further reduces tens of milliseconds of test time with minimal overhead.

The accuracy of this approach has been shown to be well within acceptable limits for production testing. However, in order for this approach to work, the test signal must already be settled to its final amplitudes even though the overall signal may not be settled. This is often the case in that the test tones which make up the test signal often settle at different rates. For example, a high pass filter settles very quickly at high frequencies, but more slowly with low frequency components.

Figure 11:
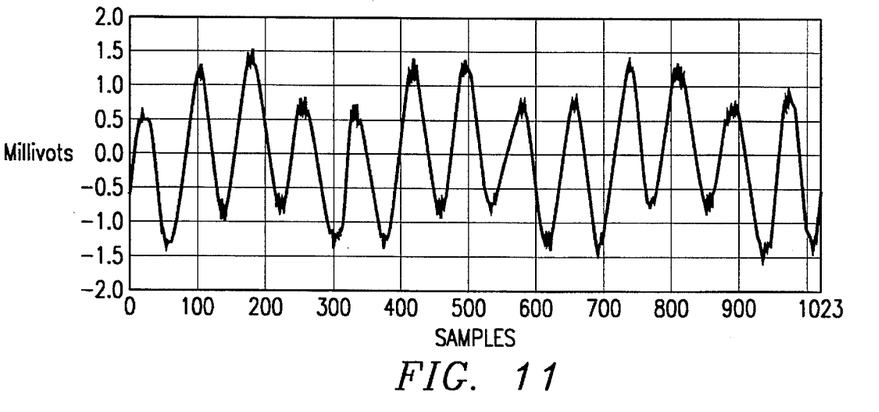
FIG. 11 shows a test signal with 60 Hertz power hum interference.
Figure 12:
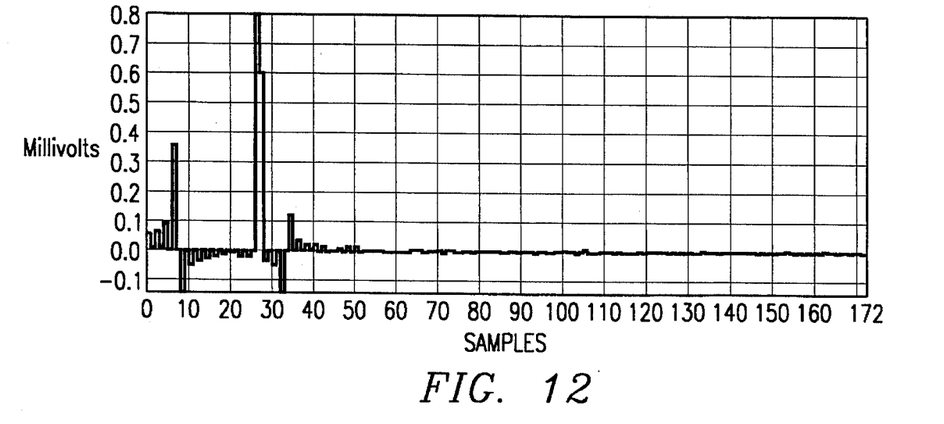
FIG. 12 shows a non-windowed FFT of the test signal with 60 Hertz power hum of FIG. 11.
Figure 13:
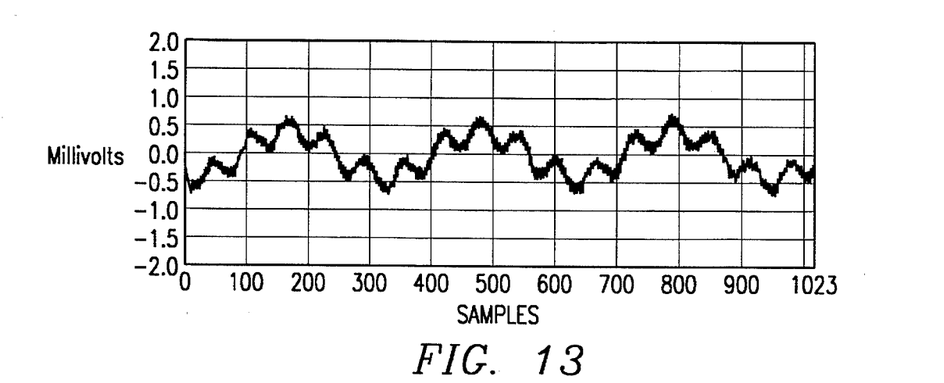
FIG. 13 shows the 60 Hertz power hum extracted from the signal of FIG. 11.
Figure 14:
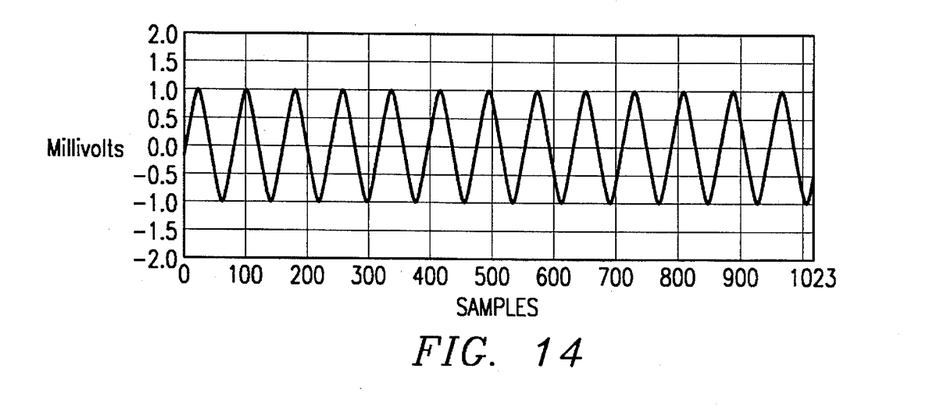
FIG. 14 shows the test signal recovered from the signal of FIG. 11.

The spectral interpolation technique of the present invention also allows the test engineer to separate a test signal from a non-coherent sine wave interference signal (60 Hertz power hum, for example). The simulated signal shown in FIG. 11 represents a low level single tone test signal with 60 Hertz power hum interference and random noise. The 60 Hertz power hum interference signal illustrated in FIG. 11 has components at 60, 180 and 300 Hertz. Notice that the non-windowed FFT, shown in FIG. 11, shows a fairly well behaved spectrum, which can be interpolated at the known test signal frequency (or frequencies) to generate the settled signal energy level. Using the spectral interpolation method of the present invention, the 60 Hertz power hum signal can be isolated, as shown in FIG. 12. Then, again, as shown in FIG. 13, the settled signal can be recovered by subtracting the extracted 60 Hertz power hum signal from the original signal.

The exact interpolation scheme used to reconstruct the interference signal's spectrum component at the test signal frequency (or frequencies) may vary widely. The various forms of interpolation include Taylor series, simple 2-point, multipoint, best fit, etc. The important feature of this invention is that the non-windowed FFT spectrum is interpolated using estimated values of the unknown interference signal calculated using one of the above noted methods of interpolation to estimate the interference signal's spectrum components at the known test frequency (or frequencies) as perfectly as possible.

The preferred interpolation method of the spectral interpolation technique of the present invention is a simple 4-point calculation. This calculation gives very accurate estimates of the ideal interference spectrum. It is also relatively immune to the effects of random noise, unlike some of the more complicated calculations. The preferred 4-point calculations are:

$$S(b) = \frac{S(b-1) + S(b+1)}{2} + \frac{1}{3}\left[\frac{S(b-1) + S(b+1)}{2} - \frac{S(b-2) + S(b+2)}{2}\right]$$

where S(b) is the sine component and $$C(b) = \frac{C(b-1) + C(b+1)}{2} + \frac{1}{3}\left[\frac{(C(b-1) + C(b+1)}{2} - \frac{C(b-2) + C(b+2)}{2}\right]$$

where C(b) is the cosine component.

In both of the above equations, b is the FFT bin number of the undersettled signal which contains a component of the test signal; S(b) is the interpolated sine component of the undersettled signal at FFT bin b; S(b−1), S(b+1), S(b−2), and S(b+2) are four adjacent sine components of the undersettled signal spectrum; C(b) is the interpolated cosine component of the undersettled signal at FFT bin b; and C(b−1), C(b+1), C(b−2), and C(b+2) are four adjacent cosine components of the undersettled signal spectrum.

The preferred embodiment of the present invention is as implemented using a Teradyne A580 mixed signal tester. The Teradyne A580 mixed signal tester includes a Precision Low Frequency Source (PLFSRC) module, used as the arbitrary waveform generator (AWG) 20; a Precision Low Frequency Digitizer (PLFDIG) module, used for the waveform digitizer 40; a DSP 50, implemented using a Mercury array processor; and a tester computer, a Sun Spark 10 workstation, in which program control and all calculations, other than the digital signal processing calculations done by the DSP 50, are performed. The Teradyne A580 mixed signal tester also provides synchronous clocking for the system of the present invention within its architecture.

Although the present invention has been described in detail, it should be understood that various changes, substitutions and alterations can be made thereto without departing from the spirit and scope of the present invention as defined by the appended claims.

What is claimed is:

1. A method of eliminating interference from an undersettled electrical signal, said undersettled electrical signal including a test signal at a known frequency, comprising the steps of:

providing a digitized version of the undersettled signal;

generating a frequency spectrum of said digitized version of said undersettled electrical signal;

spectrally interpolating said frequency spectrum of said digitized version of said undersettled electrical signal to remove said test signal from said frequency spectrum to generate an interference signal frequency spectrum; and subtracting said interference signal frequency spectrum from said undersettled electrical signal frequency spectrum to generate a settled signal spectrum.

2. A method of eliminating interference from an undersettled electrical signal, the undersettled electrical signal including a test signal at a known frequency, comprising the steps of:

providing a digitized version of said undersettled electrical signal;

generating a frequency spectrum of said digitized version of said undersettled electrical signal, said frequency spectrum having a spectrum component at said known frequency, said spectrum component including a test signal component and an unknown interference signal component;

spectrally interpolating said frequency spectrum to eliminate said test signal component from said frequency spectrum to form an interference signal spectrum; and subtracting said interference signal spectrum from said frequency spectrum to form a settled signal spectrum.

3. A method of eliminating interference from an undersettled electrical signal, the undersettled electrical signal including a test signal at a known frequency, comprising the steps of:

providing a digitized version of said undersettled electrical signal;

generating a frequency spectrum of said digitized version of said undersettled signal, said frequency spectrum having a spectrum component at said known frequency, said spectrum component including a test signal component and an unknown interference signal component;

determining said unknown interference signal component by spectral interpolation;

replacing said spectrum component at said known frequency with said unknown interference signal component to form an interference signal spectrum; and subtracting said interference signal spectrum from said frequency spectrum to form a settled signal spectrum.

4. The method of claim 3, wherein said generating step includes the step of generating a non-windowed fast fourier transform of said undersettled electrical signal.

5. The method of claim 3, wherein said determining step includes the step of determining a 2-point interpolation of two adjacent spectrum components, said spectrum component at said known frequency occurring at component location b, and said two adjacent spectrum components occurring at locations b−1 and b+1.

6. The method of claim 5, wherein said step of determining said 2-point interpolation of two adjacent spectrum components includes the steps of determining a sine component, S(b), and determining a cosine component, C(b).

7. The method of claim 6, wherein said step of determining said sine component, S(b), of said 2-point interpolation includes the step of determining said sine component by the formula:

$$S(b) = \frac{S(b-1) + S(b+1)}{2}$$

8. The method of claim 6, wherein said step of determining said cosine component, C(b), of said 2-point interpolation includes the step of determining said sine component by the formula:

$$C(b) = \frac{C(b-1) + C(b+1)}{2}$$

9. The method of claim 3, wherein said determining step includes the step of determining a 4-point interpolation of four adjacent spectrum components, said spectrum component at said known frequency occurring at component location b, and said four adjacent spectrum components occurring at locations b−2, b−1, b+1, and b+2.

10. The method of claim 9, wherein said step of determining said 4-point interpolation of four adjacent spectrum components includes the steps of determining a sine component, S(b), and determining a cosine component, C(b).

11. The method of claim 10, wherein said step of determining said sine component, S(b), of said 4-point interpolation includes the step of determining said sine component by the formula:

$$S(b) = \frac{S(b-1) + S(b+1)}{2} + \frac{1}{3}\left[\frac{S(b-1) + S(b+1)}{2} - \frac{S(b-2) + S(b+2)}{2}\right]$$

12. The method of claim 10, wherein said step of determining said cosine component, C(b), of said 4-point interpolation includes the step of determining said cosine component by the formula:

$$C(b) = \frac{C(b-1) + C(b+1)}{2} + \frac{1}{3}\left[\frac{(C(b-1) + C(b+1)}{2} - \frac{C(b-2) + C(b+2)}{2}\right]$$

13. A method of testing an electrical device having an undersettled signal output, said undersettled signal output including a test signal generated at a known frequency, comprising the steps of:

provided a digitized version of the undersettled signal output;

generating a frequency spectrum of said digitized version of said undersettled signal, said frequency spectrum having a spectrum component at said known frequency, said spectrum component comprising a test signal component and an unknown interference signal component;

spectrally interpolating said frequency spectrum to remove said test signal component from said frequency spectrum to form an interference signal spectrum;

subtracting said interference signal spectrum from said frequency spectrum of said undersettled signal to generate a settled signal spectrum; and performing at least one performance test on the electrical device using said settled signal spectrum.

14. A system for eliminating interference from an undersettled electrical signal, said undersettled electrical signal including a test signal generated at a known frequency, comprising:

first means responsive to said undersettled electrical signal for producing a digitized version of said undersettled electrical signal;

second means responsive to said digitized version of said undersettled electrical signal for transforming said digitized version of said undersettled electrical signal into a transformed signal;

third means responsive to said transformed signal for spectrally interpolating said transformed signal to form an interference signal; and fourth means responsive to said interference signal and said transformed signal for eliminating said interference signal from said transformed signal generating said settled signal output.

* * * * *